United States Patent [19]

St. Cyr et al.

[11] Patent Number: 4,719,810

[45] Date of Patent: Jan. 19, 1988

[54] DRIVE MECHANISM FOR ELECTRICAL COMPONENT PLACEMENT HEAD

[75] Inventors: Paul L. St. Cyr, Middleton; Vitaly Bandura, Danvers, both of Mass.

[73] Assignee: USM Corporation, Farmington, Conn.

[21] Appl. No.: 863,747

[22] Filed: May 15, 1986

[51] Int. Cl.⁴ ............................................. F16H 25/24
[52] U.S. Cl. ............................... 74/89.15; 74/424.8 R
[58] Field of Search ..... 74/89.15, 424.8 R, 424.8 VA; 83/631; 100/289; 269/60; 228/6.2; 29/739, 740, 741; 901/21

[56] References Cited

U.S. PATENT DOCUMENTS

| | | | |
|---|---|---|---|
| 185,991 | 1/1877 | Watkins | 83/631 |
| 2,368,345 | 1/1945 | Clark | 74/424.8 R |
| 2,688,951 | 9/1954 | Sears | 74/424.8 R |
| 2,896,213 | 7/1959 | Alderman et al. | 1/102 |
| 3,046,808 | 7/1962 | DeMart | 74/424.8 R |
| 3,488,672 | 1/1970 | Martyn | 29/626 |
| 3,550,238 | 12/1970 | Allen et al. | 29/203 |
| 3,594,889 | 7/1971 | Clark | 29/203 B |
| 3,764,772 | 10/1973 | Matuschek | 228/6.2 X |
| 3,803,927 | 4/1974 | Lawler | 74/89.15 |
| 3,824,905 | 7/1974 | Jablonsky | 74/89.15 X |
| 4,080,730 | 3/1978 | Woodman, Jr. | 29/741 X |
| 4,089,624 | 5/1978 | Nichols et al. | 74/89.15 X |
| 4,151,804 | 5/1979 | Wache et al. | 74/89.15 X |
| 4,175,721 | 11/1979 | Lempa, Jr. | 74/424.8 R X |
| 4,245,385 | 1/1981 | Zemek et al. | 29/741 X |
| 4,355,575 | 10/1982 | Goldhammer | 100/289 X |
| 4,464,833 | 8/1984 | Duncan | 29/718 |
| 4,518,298 | 5/1985 | Yasukawa | 901/21 X |
| 4,541,609 | 9/1985 | Smith | 74/89.15 X |
| 4,553,323 | 11/1985 | Clark | 29/741 |

FOREIGN PATENT DOCUMENTS

| | | | |
|---|---|---|---|
| 507699 | 4/1976 | U.S.S.R. | 74/424.8 R |
| 569783 | 9/1977 | U.S.S.R. | 74/424.8 R |

Primary Examiner—Allan D. Hermann
Attorney, Agent, or Firm—Spencer T. Smith

[57] ABSTRACT

A drive mechanism for raising and lowering the placement head of an electrical component assembly machine, the mechanism having a servo motor driving a lead nut engaging a lead screw which carries the placement head. The servo motor, in response to the machine control, rotates the lead nut to lower the placement head the desired distance from the board for proper placement in the board. A pair of rollers contact upper flat surfaces on the lead screw to prevent axial rotation of the lead screw.

2 Claims, 2 Drawing Figures

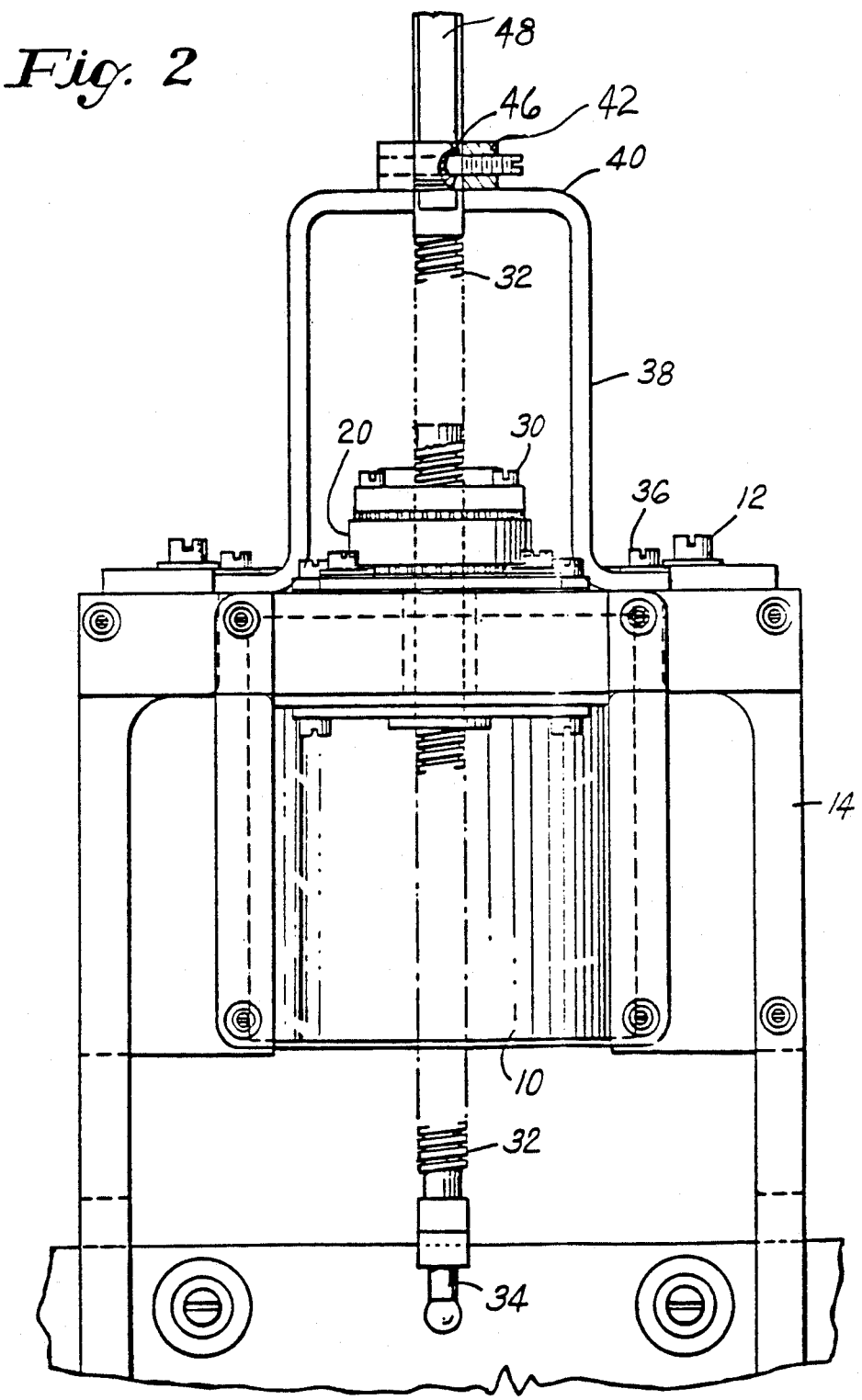

DRIVE MECHANISM FOR ELECTRICAL COMPONENT PLACEMENT HEAD

BACKGROUND OF THE INVENTION

1. Field of the Invention

This invention relates to a drive mechanism for the component placement head of an automatic electrical component assembly machine.

2. Summary of the Prior Art

In the art of automatically applying electrical components to a printed circuit board, the components are supplied to the placement head of the machine in a desired sequence for placement on the board. The components may be in a reel in which the component leads are taped to present the components in a taped series to the placement head. The placement head contains a mechanism to sever the component leads from the tape, form the leads at a right angle to the component body and insert the leads into preselected openings in the board. Thereafter, a cut-clinch mechanism cuts and forms the leads protruding through the board undersurface to lock the component to the board. Machines of this type are disclosed in U.S. Pat. Nos. 3,488,672, 3,594,889, 4,080,730 and 4,464,833.

Other assembly machines have placement heads that are adapted to receive DIP type components from a source and insert the leads of the component into the openings in the board. In like fashion, a cut-clinch mechanism will secure the component to the board. Machines of this type are illustrated in U.S. Pat. No. 3,550,238.

In the operation of these machines, there is a vertically driven placement head which travels from a position to receive the component from the source to a position to insert the component leads into the opening in the board. The mechanism to vertically reciprocate the placement head has, in the past, been a pneumatic cylinder arrangement (such as illustrated in U.S. Pat. No. 2,896,213) which drives a linkage causing the placement head to move up and down. Because of the varying depth to which the placement head must travel due to the varying diameter of the components being inserted (see U.S. Pat. No. 3,594,889) and the different diameter of the leads, the prior pneumatically driven mechanisms have required an automatically adjustable depth stop to control the depth at which the placement head will move toward the board, for any given component being inserted. An example of such a depth stop is shown in U.S. Pat. No. 4,553,323.

SUMMARY OF THE INVENTION

It is the object of this invention to provide a servo motor drive mechanism for vertically reciprocating the placement head of an electrical component assembly machine; the drive mechanism also functioning to automatically control the depth of the placement head from the board to accommodate different diameters of components and diameter of the leads.

It is also an object of this invention to use a servo motor to drive a timing belt which drives a lead nut carrying a lead screw attached to the placement head of an electrical component assembly machine. A software control through an encoder will supply a predetermined number of pulses to the servo motor to drive the timing belt and thus rotate the lead nut the required turns to vertically reciprocate the lead screw to lower the placement head the predesired distance from the board for the given component being inserted into the board. In this manner, the placement head is reciprocated toward and away from the board and located the proper depth from the board for any given component being inserted.

It is a further object of this invention to vertically reciprocate the placement head of an electrical component assembly machine through a servo motor driven lead nut which carries a lead screw attached to the insertion head; the lead screw having opposed flat sides cooperating with fixed rollers to prevent axial rotation of the lead screw while being driven by the lead nut.

BRIEF DESCRIPTION OF THE DRAWINGS

FIG. 2 is a front elevational view.

DESCRIPTION OF THE PREFERRED EMBODIMENT

Figure 1:
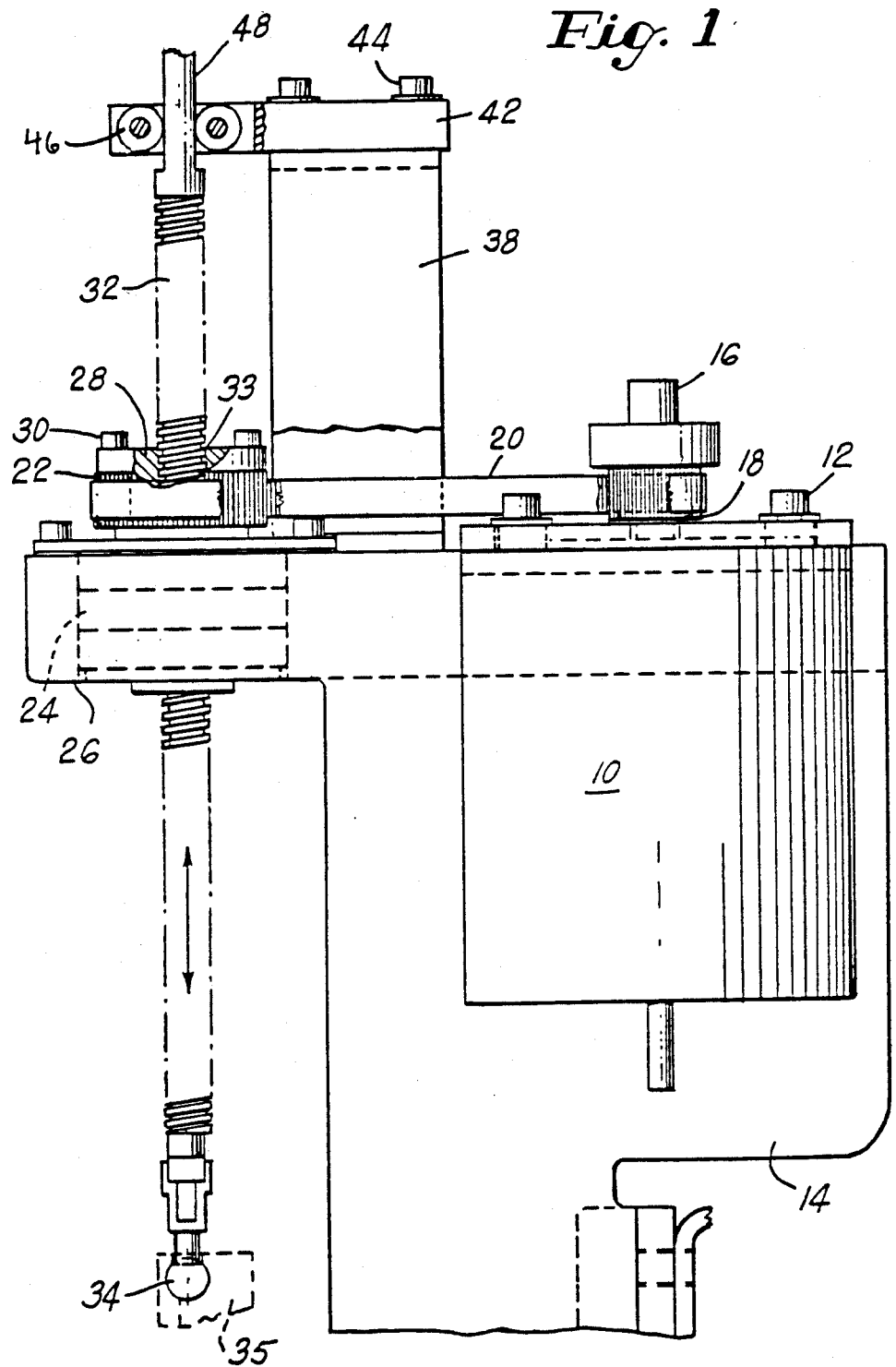
FIG. 1 is a side elevational view of the drive mechanism of this invention.

Machines for automatically placing electrical components into printed circuit boards have a placement head for inserting the leads of the component into the preselected openings in the board. Thereafter, a cut-clinch mechanism under the board severs the excess lead and forms the lead over to physically attach the component to the board. These machines may handle DIP type components as illustrated in U.S. Pat. No. 3,550,238, or may handle axial lead components as illustrated in U.S. Pat. No. 3,594,889. Other machines, such as illustrated in U.S. Pat. No. 4,501,064, are used to surface mount leadless components to the board.

In each of the aforementioned types of assembly machines, the placement head is driven vertical to a raised position to receive a component from a source to a lowered position to place the component on the board. Also, since the components may vary in thickness, the placement head must be automatically adjustable in response to machine control to be properly spaced from the surface of the board so that proper component placement occurs without damage to the component or the board. It is in this environment that this novel placement head drive is utilized to accomplish the mentioned objectives.

Attention is now directed to FIG. 1 which illustrates a servo motor 10 carried by bolts 12 on a frame 14 secured to the main machine frame (not shown). The motor shaft 16 carries a pulley 18 engaging a timing belt 20. The belt 20 engages a pulley 22 carried in bearings 24 on frame 14. A lead nut 28 is mounted in the pulley 22 by bolts 30 and is driven through the timing belt 20 by servo motor 10.

A lead screw 32 is carried in the lead nut 28 with zero backlash clearance. Attached to the lower end 34 of the lead screw 32 is the placement head (partially shown at 35) of the electrical component assembly machine.

Attached to the frame 14 by bolts 36 is a u-shaped support frame 38 having a top portion 40 carrying a roller bearing block 42 by bolts 44. The rollers 46 are carried in bearing block 42 and are positioned on each side of the lead screw 32 to engage the flat sides 48 of the lead screw. Thus, as the lead screw 32 is driven by the lead nut 28 through their threaded engagement 33, the rollers 46 contacting flat surfaces 48 will prevent axial rotation of the lead screw 32.

In operation, a machine control through an encoder will pulse the servo motor 10 turning pulley 18 and through the timing belt 20, the pulley 22 will be rotated. The lead nut 28 is then rotated raising or lowering the lead screw 32, (and thus the placement head) the desired predetermined amount in accordance with the phase of the machine operation. When the placement head receives a component from a source, the lead screw is raised. Thereafter, in accordance with the number of pulses received, the servo motor will rotate the lead nut 28 and lower the lead screw 32 the desired amount for placement of component on the board. As the lead screw is lowered, the rollers 46 in contact with the flat sides 48 of the lead screw 32 prevent axial rotation of the lead screw 32.

After the component has been placed on the board, the machine control will reverse servo motor 10 and raise the lead screw and thus the placement head. Thereafter, the machine control, knowing the next component in sequence to be placed (and thus know the component thickness) will, after the placement head receives the component, pulse the servo motor the right number of times to lower the lead screw 32 to the right depth from the board to place the component on the board without damage to the component or the board. In this manner, a simple drive member can raise the placement head to receive a component from a source and lower the component to the required position for placement on the board.

We claim:

1. A component placement machine having a placement head for placing electronic components onto or into printed circuit boards comprising:
   lead screw means;
   the bottom of said lead screw means being adapted to attach to the placement head of the machine;
   means for vertically displacing said lead screw means including;
      frame means;
      a bearing assembly supported by said frame means and having a pulley and a lead nut;
      said bearing assembly having a hole therein through which said lead screw means extends;
      servo motor means;
      timing belt means interconnecting said servo motor means and said pulley for rotatively driving said lead nut, and
      said frame means including means for preventing the rotation of said lead screw means whereby rotation of said lead unit nut will result in the vertical displacement of said lead screw means.

2. A component placement machine according to claim 1 wherein said preventing means comprises at least one roller contacting a flat surface of said lead screw means.

* * * * *